(12) United States Patent
Rasmussen

(10) Patent No.: US 11,026,029 B2
(45) Date of Patent: Jun. 1, 2021

(54) HEARING AID WITH A FLEXIBLE CARRIER ANTENNA AND RELATED METHOD

(71) Applicant: GN HEARING A/S, Ballerup (DK)

(72) Inventor: Benny Rasmussen, Frederiksberg (DK)

(73) Assignee: GN Hearing A/S, Ballerup (DK)

(*) Notice: Subject to any disclaimer, the term of this patent is extended or adjusted under 35 U.S.C. 154(b) by 0 days.

(21) Appl. No.: 16/294,096

(22) Filed: Mar. 6, 2019

(65) Prior Publication Data
US 2019/0208341 A1 Jul. 4, 2019

Related U.S. Application Data

(63) Continuation of application No. 14/962,543, filed on Dec. 8, 2015, now Pat. No. 10,277,996.

(30) Foreign Application Priority Data

Dec. 1, 2015 (DK) ................................ 2015 70782
Dec. 1, 2015 (EP) ..................................... 15197184

(51) Int. Cl.
*H04R 25/00* (2006.01)
*H01Q 1/27* (2006.01)
(Continued)

(52) U.S. Cl.
CPC ............. *H04R 25/60* (2013.01); *H01Q 1/273* (2013.01); *H01Q 1/38* (2013.01); *H01Q 7/00* (2013.01);
(Continued)

(58) Field of Classification Search
CPC .......... H04R 25/60; H04R 1/273; H04R 1/38; H04R 7/00; H04R 25/554; H05K 1/028;
(Continued)

(56) References Cited

U.S. PATENT DOCUMENTS

| 2015/0036854 A1 | 2/2015 | Polinske et al. |
| 2015/0201288 A1 | 7/2015 | Bergner et al. |
| 2015/0296312 A1* | 10/2015 | Nikles .................... H01Q 1/273 381/315 |

FOREIGN PATENT DOCUMENTS

| CN | 202474274 U | 10/2012 |
| CN | 103367864 A | 10/2013 |
| (Continued) | | |

OTHER PUBLICATIONS

Office Action and Abstract dated Apr. 26, 2012 for related Japanese Patent Application No. JP 2012-85298.
(Continued)

*Primary Examiner* — Phylesha Dabney
(74) *Attorney, Agent, or Firm* — Vista IP Law Group, LLP

(57) ABSTRACT

A hearing aid having an electrical assembly, the electrical assembly includes a printed circuit board having a first board surface and a second board surface, the printed circuit board having a first pad in a first pad region on the first board surface, the first pad region having a first board normal; a flexible printed circuit board comprising an antenna, the antenna having a first terminal in a first terminal region on a first flexfilm surface of the flexible printed circuit board, the first terminal region having a first terminal normal; and first electrically conductive material connecting the first pad and the first terminal, and wherein the first terminal normal and the first board normal forms a first angle that is anywhere from 30° to 150°.

30 Claims, 8 Drawing Sheets

(51) Int. Cl.
*H01Q 1/38* (2006.01)
*H05K 1/02* (2006.01)
*H05K 1/11* (2006.01)
*H01Q 7/00* (2006.01)
*H05K 3/36* (2006.01)
*H05K 1/16* (2006.01)
*H05K 1/14* (2006.01)

(52) U.S. Cl.
CPC .......... *H04R 25/554* (2013.01); *H05K 1/028* (2013.01); *H05K 1/111* (2013.01); *H05K 3/363* (2013.01); *H04R 2225/51* (2013.01); *H05K 1/147* (2013.01); *H05K 1/16* (2013.01); *H05K 2201/10098* (2013.01)

(58) Field of Classification Search
CPC .... H05K 1/111; H05K 3/363; H05K 2225/51; H05K 1/16; H05K 2201/10098
USPC ........................................................ 381/324
See application file for complete search history.

(56) References Cited

FOREIGN PATENT DOCUMENTS

| | | | |
|---|---|---|---|
| CN | 103384357 | A | 11/2013 |
| DE | 3616773 | A1 | 11/1987 |
| EP | 0089452 | A1 | 9/1983 |
| EP | 1 681 903 | A2 | 7/2006 |
| EP | 1 681 903 | A3 | 3/2007 |
| EP | 2 229 009 | A1 | 9/2010 |
| EP | 2 680 366 | A1 | 1/2014 |
| EP | 2 849 282 | A1 | 3/2015 |
| GB | 2 444 750 | A | 6/2008 |
| GB | 2508679 | | 6/2014 |
| JP | H1289190 | A | 11/1989 |
| JP | H1032409 | A | 2/1998 |
| JP | 2001345621 | A | 12/2001 |
| WO | WO 2015/127972 | A1 | 9/2015 |

OTHER PUBLICATIONS

First Office Action dated Dec. 13, 2019 for related Chinese Patent Application No. 2015P00025WOUS.
Extended European Search Report dated Jun. 7, 2016 for corresponding EP Patent Application No. 15197184.3, 6 pages.
First Technical Examination dated Jun. 15, 2016 for corresponding EP Patent Application No. PA 2015 70782, 5 pages.
Communication Pursuant to Article 94(3) dated Feb. 15, 2019 for corresponding European Application No. 15197184.3.
Non Final Office Action dated Jan. 17, 2017 for related U.S. Appl. No. 14/962,543.
Final Office Action dated Jun. 28, 2017 for related U.S. Appl. No. 14/962,543.
Advisory Action dated Dec. 5, 2017 for related U.S. Appl. No. 14/962,543.
Non Final Office Action dated Jan. 8, 2018 for related U.S. Appl. No. 14/962,543.
Final Office Action dated Jul. 26, 2018 for related U.S. Appl. No. 14/962,543.
Notice of Allowance and Fee(s) dated Dec. 5, 2018 for related U.S. Appl. No. 14/962,543.
Communication pursuant to Article 94(3) dated Jun. 12, 2020 for corresponding EP Patent Appln. No. 15197184.3.
$2^{nd}$ Office Action dated Jun. 9, 2020 for corresponding Japanese Application No. 2018-52047, 6 Pages.

* cited by examiner

HEARING AID WITH A FLEXIBLE CARRIER ANTENNA AND RELATED METHOD

RELATED APPLICATION DATA

This application is a continuation of U.S. patent application Ser. No. 14/962,543 filed on Dec. 8, 2015, now U.S. Pat. No. 10,277,996, which claims priority to, and the benefit of, Danish Patent Application No. PA 2015 70782 filed Dec. 1, 2015, and European Patent Application No. 15197184.3 filed Dec. 1, 2015. The entire disclosures of both of the above applications are expressly incorporated by reference herein.

FIELD

The present disclosure relates to a hearing aid with an antenna, and in particular to a hearing aid with an antenna formed on a flexible carrier. Further, the present disclosure relates to a method for manufacturing an electrical assembly for a hearing aid

BACKGROUND

The developments within wireless technologies for hearing devices and the continuous efforts to make hearing devices smaller and more cost effective to manufacture has led to the use of flexible carriers incorporating one or more antennas in hearing devices.

SUMMARY

There is a desire for reducing the size of the electrical assembly of a hearing device.

Disclosed herein is a hearing aid comprising an electrical assembly. The electrical assembly comprises a printed circuit board having a first board surface and a second board surface, the printed circuit board having a first pad in a first pad region on the first board surface, the first pad region having a first board normal. The electrical assembly comprises a flexible printed circuit board comprising an antenna, e.g. denoted first antenna, having a first terminal in a first terminal region on a first flexfilm surface of the flexible printed circuit board, the first terminal region having a first terminal normal. The electrical assembly comprises first electrically conductive material connecting the first pad and the first terminal, and the first terminal normal and the first board normal forms a first angle in the range from 30° to 150°.

Also disclosed is a method for manufacturing an electrical assembly for a hearing aid. The electrical assembly comprises a printed circuit board and a flexible printed circuit board, the printed circuit board having a first board surface and a second board surface, the printed circuit board having a first pad in a first pad region on the first board surface, the first pad region having a first board normal. The flexible printed circuit board has a first flexfilm surface and a second flexfilm surface, the flexible printed circuit board comprising an antenna, e.g. denoted first antenna, having a first terminal in a first terminal region on the first flexfilm surface, the first terminal region having a first terminal normal. The method comprises arranging the printed circuit board and the flexible printed circuit board such that the first terminal normal and the first board normal form a first angle in the range from 30° to 150°; and connecting the first pad and the first terminal with a first electrically conductive material.

The hearing aid and method as disclosed provide increased design flexibility in the design of the electrical assembly of a hearing device. In particular, the printed circuit board may have a simpler routing and/or reduced size.

A hearing aid having an electrical assembly, the electrical assembly includes a printed circuit board having a first board surface and a second board surface, the printed circuit board having a first pad in a first pad region on the first board surface, the first pad region having a first board normal; a flexible printed circuit board comprising an antenna, the antenna having a first terminal in a first terminal region on a first flexfilm surface of the flexible printed circuit board, the first terminal region having a first terminal normal; and first electrically conductive material connecting the first pad and the first terminal, and wherein the first terminal normal and the first board normal forms a first angle that is anywhere from 30° to 150°.

Optionally, the electrical assembly comprises an electrical component mounted on the first board surface or on the second board surface.

Optionally, the first angle is anywhere from 80° to 100°.

Optionally, the printed circuit board has a first indentation in a first edge part of the printed circuit board, the first indentation accommodating at least a part of the first terminal.

Optionally, the printed circuit board has an edge with an edge part and wherein the first electrically conductive material connects at least a part of the first flexfilm surface to the edge part of the printed circuit board.

Optionally, the printed circuit board comprises a second pad in a second pad region on the first board surface or on the second board surface, the second pad region having a second board normal; wherein the flexible printed circuit board has a second terminal in a second terminal region on the first flexfilm surface or on a second flexfilm surface of the flexible printed circuit board, the second terminal region having a second terminal normal; and wherein the electrical assembly comprises second electrically conductive material connecting the second pad and the second terminal, and wherein the second terminal normal and the second board normal forms a second angle that is anywhere from 30° to 150°.

Optionally, the printed circuit board has a first indentation in a first edge part of the printed circuit board, the first indentation accommodating at least a part of the first terminal; and wherein the printed circuit board has a second indentation in a second edge part of the printed circuit board, the second indentation accommodating at least a part of the second terminal.

Optionally, the printed circuit board comprises a third pad in a third pad region on the first board surface or on the second board surface, the third pad region having a third board normal; wherein the flexible printed circuit board has a third terminal in a third terminal region on the first flexfilm surface or on the second flexfilm surface, the third terminal region having a third terminal normal; and wherein the electrical assembly comprises third electrically conducting material connecting the third pad and the third terminal, and wherein the third terminal normal and the third board normal forms a third angle that is anywhere from 30° to 150°.

Optionally, the printed circuit board has a third indentation in a third edge part of the printed circuit board, the third indentation accommodating at least a part of the third terminal.

A method for manufacturing an electrical assembly for a hearing aid, the electrical assembly comprising a printed circuit board and a flexible printed circuit board, the printed circuit board having a first board surface and a second board surface, the printed circuit board having a first pad in a first pad region on the first board surface, the first pad region having a first board normal, wherein the flexible printed circuit board has a first flexfilm surface and a second flexfilm surface, the flexible printed circuit board comprising an antenna, the antenna having a first terminal in a first terminal region on the first flexfilm surface, the first terminal region having a first terminal normal, the method includes: arranging the printed circuit board and the flexible printed circuit board such that the first terminal normal and the first board normal form a first angle that is anywhere from 30° to 150°; and connecting the first pad and the first terminal with a first electrically conductive material.

Other features and advantageous will be described in the detail description.

BRIEF DESCRIPTION OF THE DRAWINGS

The above and other features and advantages will become readily apparent to those skilled in the art by the following detailed description of exemplary embodiments thereof with reference to the attached drawings, in which.

DETAILED DESCRIPTION

Figure 1:
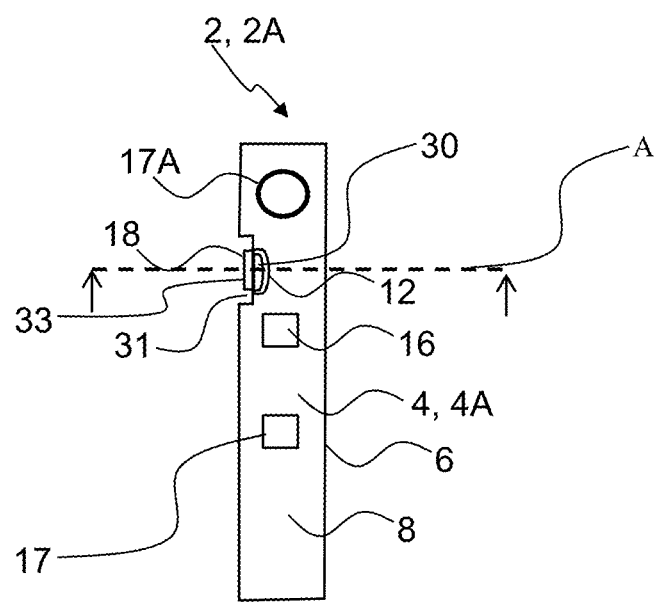
FIG. 1 is a schematical top view of an electrical assembly

Various embodiments are described hereinafter with reference to the figures. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. Throughout, the same reference numerals are used for identical or corresponding parts.

The hearing aid comprises an electrical assembly. The hearing aid may be a Behind-The-Ear (BTE) hearing aid. The electrical assembly, e.g. in a BTE hearing aid is typically supported by a frame structure on which one or more shell parts are mounted.

The electrical assembly comprises a printed circuit board having a first board surface and a second board surface. The second board surface may be parallel to the first board surface. The printed circuit board has one or more pads including a first pad in a first pad region on the first board surface, the first pad region having a first board normal. The one or more pads may include a second pad in a second pad region on the first board surface and/or on the second board surface. The second pad may be connected to a ground plane of the printed circuit board. The second pad region has a second board normal. The first board normal and the second board normal may be parallel. The first board normal and the second board normal may form an angle less than 45 degrees or in the range from 135 degrees to 225 degrees.

The one or more pads may include a third pad in a third pad region on the first board surface and/or on the second board surface. The third pad region has a third board normal. The first board normal and the third board normal may be parallel. The first board normal and the third board normal may form an angle less than 45 degrees or in the range from 135 degrees to 225 degrees.

The electrical assembly comprises a flexible printed circuit board, also denoted flexible carrier. The flexible printed circuit board may have a thickness in the range from 5 μm to 1,000 μm. The flexible printed circuit board may be a sheet. In an exemplary electrical assembly, the flexible printed circuit board has a thickness in the range from 12 μm to 600 μm, such as 50 μm, 100 μm, 200 μm, 300 μm, 400 μm, 500 μm or any ranges therebetween. The flexible printed circuit board has a first flexfilm surface and a second flexfilm surface. The flexible printed circuit board comprises one or more antennas including an antenna (first antenna) having a first terminal in a first terminal region on the first flexfilm surface of the flexible printed circuit board, the first terminal region having a first terminal normal. The antenna (first antenna) may have a second terminal in a second terminal region on the first flexfilm surface and/or on the second flexfilm surface of the flexible printed circuit board, the second terminal region having a second terminal normal. The first terminal region may be at least partly arranged in a first tab of the flexible printed circuit board. The second terminal region may be at least partly arranged in a second tab of the flexible printed circuit board.

The flexible printed circuit board may comprise a second antenna having a first terminal in a second terminal region on the first flexfilm surface or a second flexfilm surface of the flexible printed circuit board, the second terminal region having a second terminal normal.

The electrical assembly comprises electrically conducting material connecting a pad of the printed circuit board and a terminal of an antenna of the flexible printed circuit board. The electrically conducting material may be solder material such as a solder alloy, e.g. comprising one or more of zinc, tin, silver, copper and lead.

For example, the electrical assembly may comprise first electrically conductive material connecting the first pad and the first terminal. The first terminal normal and the first board normal may form a first angle in the range from 30° to 150°. The first angle formed by the first terminal normal and the first board normal may be in the range from 45° to 135°. In one or more exemplary electrical assemblies, the first angle formed by the first terminal normal and the first board normal may be in the range from 80° to 100°. Thereby, the required surface area for pads is reduced, which ultimately may lead to simpler routing on the printed circuit board and/or smaller printed circuit board.

The electrical assembly may comprise second electrically conductive material connecting the second pad and the second terminal. The second terminal normal and the second board normal may form a second angle in the range from 30° to 150°. The second angle formed by the second terminal normal and the second board normal may be in the range from 45° to 135°. In one or more exemplary electrical assemblies, the second angle formed by the second terminal normal and the second board normal may be in the range from 80° to 100°. Thereby, the required surface area for pads is reduced, which ultimately may lead to simpler routing on the printed circuit board and/or smaller printed circuit board.

The electrical assembly may comprise one or more electrical components, such as a first electrical component and/or a second electrical component. The electrical component(s) may respectively be mounted on the first board surface or on the second board surface.

The first electrical component may be a radio transceiver connected to the first pad, e.g. via a balun element or other (antenna) matching element/circuit. The radio transceiver may be configured for 2.4 GHz communication. The electrical assembly may comprise an antenna matching element, such as a balun element. The printed circuit board may comprise a first conductor to form an electrical connection between the first pad and a first terminal of the first electrical component (radio transceiver) or to form an electrical connection between the first pad and an antenna matching element. The printed circuit board may comprise a second conductor to form an electrical connection between the second pad and a second terminal of the first electrical component (radio transceiver) or to form an electrical connection between the second pad and an antenna matching element.

The electrical assembly may comprise a second electrical component, such as a processing unit, such as a hearing aid processor.

The electrical assembly may comprise a third electrical component, such as a microphone.

The printed circuit board has an edge and the printed circuit board may have one or more indentations in the edge. The printed circuit board may have a first indentation in a first edge part of the printed circuit board. The first indentation may accommodate at least a part of the first terminal. By arranging a part of the first terminal—and thus also a part of the flexible printed circuit board within a first indentation, the mechanical stress on the flexible printed circuit board, e.g. from shell parts or other hearing aid components, is reduced or avoided.

The printed circuit board may have a second indentation in a second edge part of the printed circuit board. The second indentation may accommodate at least a part of the second terminal. By arranging a part of the second terminal—and thus also a part of the flexible printed circuit board within a second indentation, the mechanical stress on the flexible printed circuit board, e.g. from shell parts or other hearing aid components, is reduced or avoided.

Arranging parts of the flexible printed circuit board within indentation(s) of the printed circuit board may reduce the risk of production errors, e.g. the risk of breaking the electrical assembly during hearing aid manufacture may be reduced.

An indentation, such as the first indentation and/or the second indentation, may have a maximum depth of at least 0.5 mm, such as about 1 mm. An indentation, such as the first indentation and/or the second indentation, may have a width of at least 1.0 mm, such as in the range from 2 mm to 8 mm.

The first electrically conductive material may connect at least a part of the first flexfilm surface to an edge part, e.g. a first edge part, of the printed circuit board. Connecting electrically conductive material to an edge part increases the strength of the mechanical connection between the printed circuit board and the flexible printed circuit board.

The flexible printed circuit board may have a third terminal, e.g. of first antenna or second antenna, in a third terminal region on the first flexfilm surface or on the second flexfilm surface, the third terminal region having a third terminal normal. The electrical assembly may comprise third electrically conducting material connecting the third pad and the third terminal. The third terminal normal and the third board normal may form a third angle in the range from 30° to 150°. A plurality of terminals on the flexible printed board enables more complex antenna types and/or configuration of antenna properties. The printed circuit board may have a third indentation in a third edge part of the printed circuit board. The third indentation may accommodate at least a part of the third terminal.

FIG. 1 is a schematic view of an exemplary electrical assembly 2 of a hearing aid. The electrical assembly 2 comprises a printed circuit board 4 having an edge 6, a first board surface 8 and a second board surface (not visible on FIG. 1). The printed circuit board 4 has a first pad 12 in a first pad region on the first board surface 8, the first pad region having a first board normal. The electrical assembly 2 comprises a first electrical component 16 mounted on the first board surface 8. The first electrical component 16 may in another exemplary hearing aid be mounted on the second board surface. The first electrical component 16, in FIG. 1 being a radio transceiver, is electrically connected to the first pad 12 by a first conductor, e.g. via a balun element (not shown). The electrical assembly 2 comprises a second electrical component 17 in the form of a hearing aid processor configured to compensate for hearing loss of a user. The second electrical component (hearing aid processor) 17 is mounted on the first board surface 8 and is connected to the first electrical component 16 (radio transceiver) via one or more conductors (not shown) in the printed circuit board. The electrical assembly 2 optionally comprises a third electrical component 17A in the form of a microphone or microphone assembly. The third electrical component (microphone) 17A is mounted on the first board surface 8 and is connected to the second electrical component 17 (hearing aid processor) via one or more conductors (not shown) in the printed circuit board 4, 4A.

The electrical assembly 2 comprises a flexible printed circuit board 18 comprising an antenna having a first terminal in a first terminal region on a first flexfilm surface of the flexible printed circuit board, the first terminal region having a first terminal normal. The electrical assembly 2 comprises first electrically conductive material 30 connecting the first pad 12 and the first terminal. The first terminal normal and the first board normal forms a first angle of 90°±5°. The printed circuit board 4, 4A has a first indentation 31 in a first edge part of the printed circuit board. The first indentation 31 accommodating at least a part of the first terminal arranged in a first tab 33 of the flexible printed circuit board 18.

Figure 2:
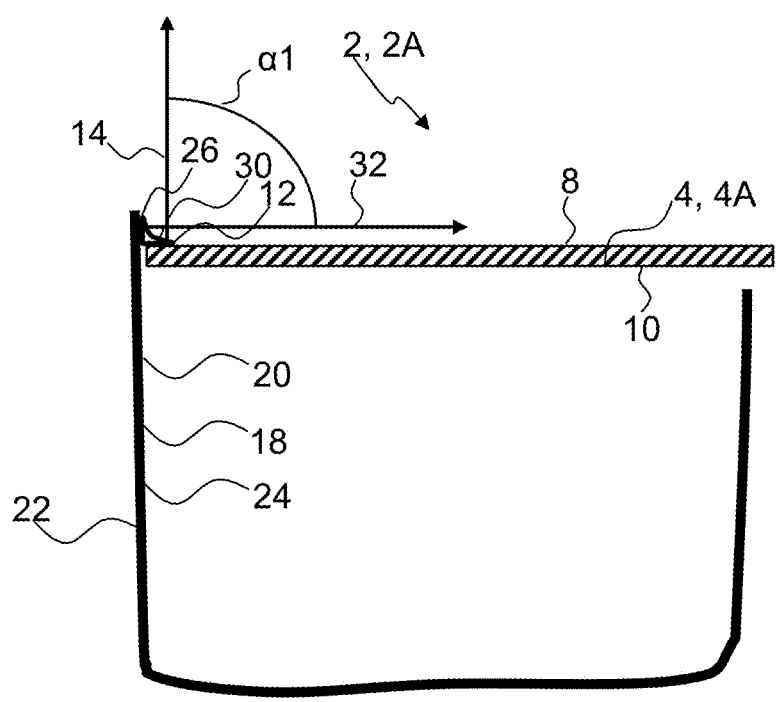
FIG. 2 is a schematical cross-sectional view of an exemplary electrical assembly.

FIG. 2 is a schematic cross-section of the electrical assembly of FIG. 1 taken along dotted line A. The flexible printed circuit board 18 comprises an antenna 24 having a first terminal 26 in a first terminal region on a first flexfilm surface 20 of the flexible printed circuit board 18. The first terminal region has a first terminal normal 32. The first electrically conductive material 30 connects the first pad 12 and the first terminal 26 such that the first terminal normal 32 and the first board normal 14 forms a first angle α1 of 90°±5°.

Figure 3:
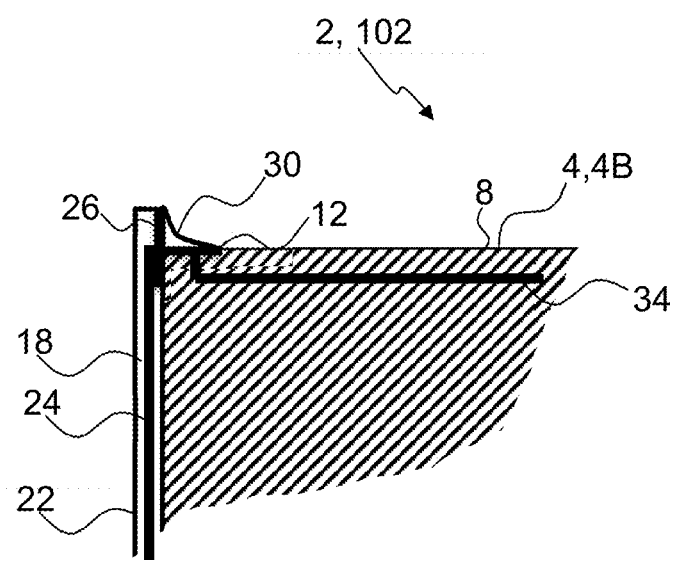
FIG. 3 shows a more detailed view of an electrical assembly.

FIG. 3 shows a more detailed view of the electrical assembly 2 in FIG. 2. The first pad 12 extends on the first board surface 8. The printed circuit board 4 comprises a first conductor 34 connecting the first pad 12 and a pad connectable to a first terminal of an electrical component, e.g. first electrical component 16, mounted on the printed circuit board 4.

Figure 4:
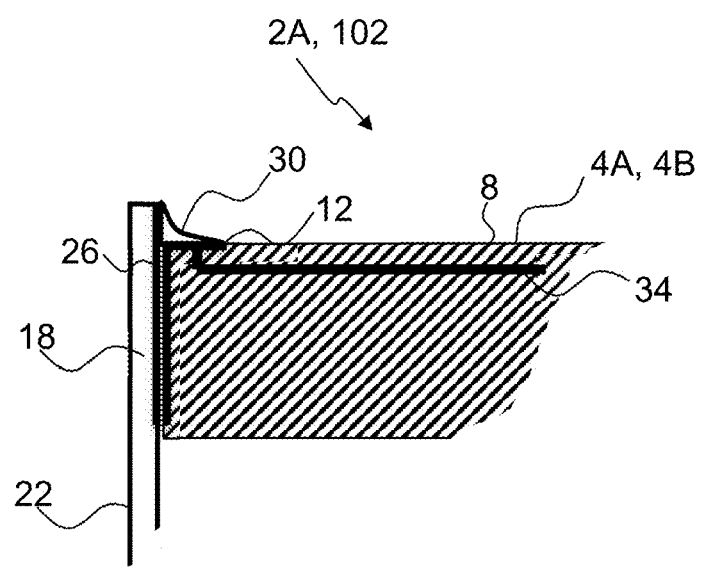
FIG. 4 shows a more detailed view of an electrical assembly.

FIG. 4 shows an exemplary schematic cross-sectional view of an electrical assembly 2A. The first pad 12 extends on the first board surface 8 and on the edge 6 of the printed circuit board. A first pad extending on the edge may reduce the required first pad area on the first board surface 8, in turn further enabling reduced size of the printed circuit board 4A. The printed circuit board 4A comprises a first conductor 34 connecting the first pad 12 and a pad connectable to a first terminal of an electrical component, e.g. first electrical component 16, mounted on the printed circuit board 4.

Figure 5:
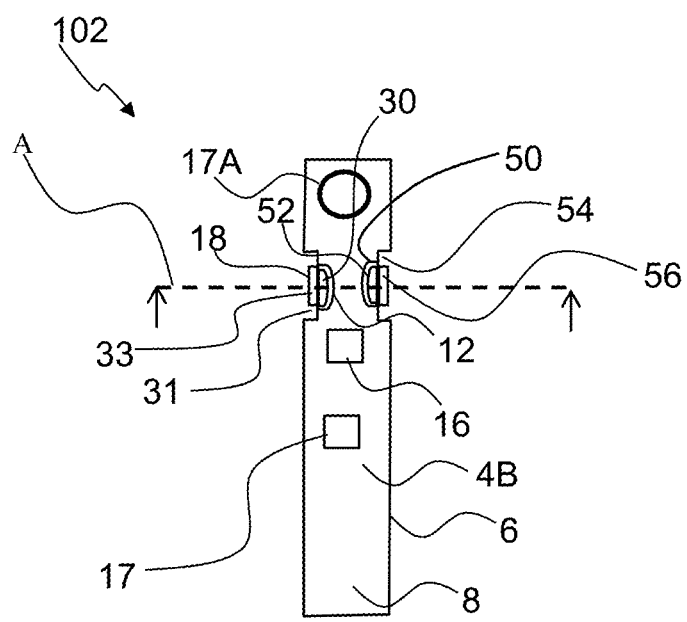
FIG. 5 is a schematical top view of an electrical assembly.

FIG. 5 is a schematic view of an exemplary electrical assembly 102 of a hearing aid. The electrical assembly 102 comprises a printed circuit board 4B having an edge 6, a first board surface 8 and a second board surface (not visible on FIG. 5). The printed circuit board 4B has a first pad 12 in a first pad region on the first board surface 8, the first pad region having a first board normal. The electrical assembly 102 comprises a first electrical component 16 mounted on the first board surface 8. The first electrical component 16 may in another exemplary hearing aid be mounted on the second board surface. The first electrical component 16, in FIG. 5 being a radio transceiver, is electrically connected to the first pad 12 by a first conductor, e.g. via a balun element (not shown). The electrical assembly 102 comprises a second electrical component 17 in the form of a hearing aid processor configured to compensate for hearing loss of a user. The second electrical component (hearing aid processor) 17 is mounted on the first board surface 8 and is connected to the first electrical component 16 (radio transceiver) via one or more conductors (not shown) in the printed circuit board 4B. The electrical assembly 102 optionally comprises a third electrical component 17A in the form of a microphone or microphone assembly. The third electrical component (microphone) 17A is mounted on the first board surface 8 and is connected to the second electrical component 17 (hearing aid processor) via one or more conductors (not shown) in the printed circuit board 4B.

The electrical assembly 102 comprises a flexible printed circuit board 18 comprising an antenna having a first terminal in a first terminal region on a first flexfilm surface of the flexible printed circuit board, the first terminal region having a first terminal normal. Further, the antenna has a second terminal in a second terminal region on the first flexfilm surface of the flexible printed circuit board, the second terminal region having a second terminal normal. The electrical assembly 102 comprises first electrically conductive material 30 connecting the first pad 12 and the first terminal. The first terminal normal and the first board normal forms a first angle of 90°±5°. The printed circuit board 102 has a first indentation 31 in a first edge part of the printed circuit board 4B. The first indentation 31 accommodates at least a part of the first terminal arranged in a first tab 33 of the flexible printed circuit board 18.

The printed circuit board 4B comprises a second pad 50 in a second pad region on the first board surface 8, the second pad region having a second board normal. The electrical assembly 102 comprises second electrically conductive material 52 connecting the second pad 50 and the second terminal of the antenna. In another exemplary electrical assembly, the flexible printed circuit board comprises a first and second antenna, wherein the second pad is connected to a first terminal of the second antenna. The second terminal normal and the second board normal forms a second angle in the range from 30° to 150°. The printed circuit board 4B has a second indentation 54 in a second edge part of the printed circuit board 4B, the second indentation 54 accommodating at least a part of the second terminal arranged in a second tab 56 of the flexible printed circuit board. The first electrical component 16 is electrically connected to the second pad 50 by a second conductor, e.g. via a balun element (not shown).

Figure 6:
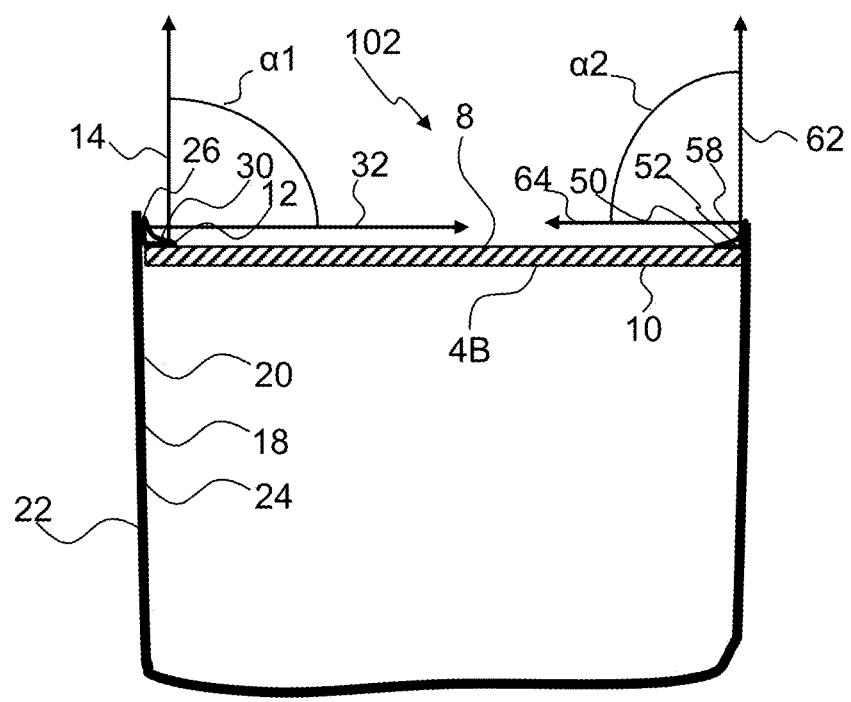
FIG. 6 is a schematical cross-sectional view of an exemplary electrical assembly.

FIG. 6 is a schematic cross-section of the electrical assembly of FIG. 5 taken along dotted line A. The flexible printed circuit board 18 comprises an antenna 24 having a first terminal 26 in a first terminal region on a first flexfilm surface 20 of the flexible printed circuit board 18. The first terminal region has a first terminal normal 32. The first electrically conductive material 30 connects the first pad 12 and the first terminal 26 such that the first terminal normal 32 and the first board normal 14 forms a first angle α1 of 90°±5°. The antenna 24 has a second terminal 58 in a second terminal region on the first flexfilm surface 20 of the flexible printed circuit board 18. The second terminal region has a second terminal normal 64. The second electrically conductive material 52 connects the second pad 50 and the second terminal 58 such that the second terminal normal 64 and the second board normal 62 forms a second angle α2 of 90°±5°.

Figure 7:
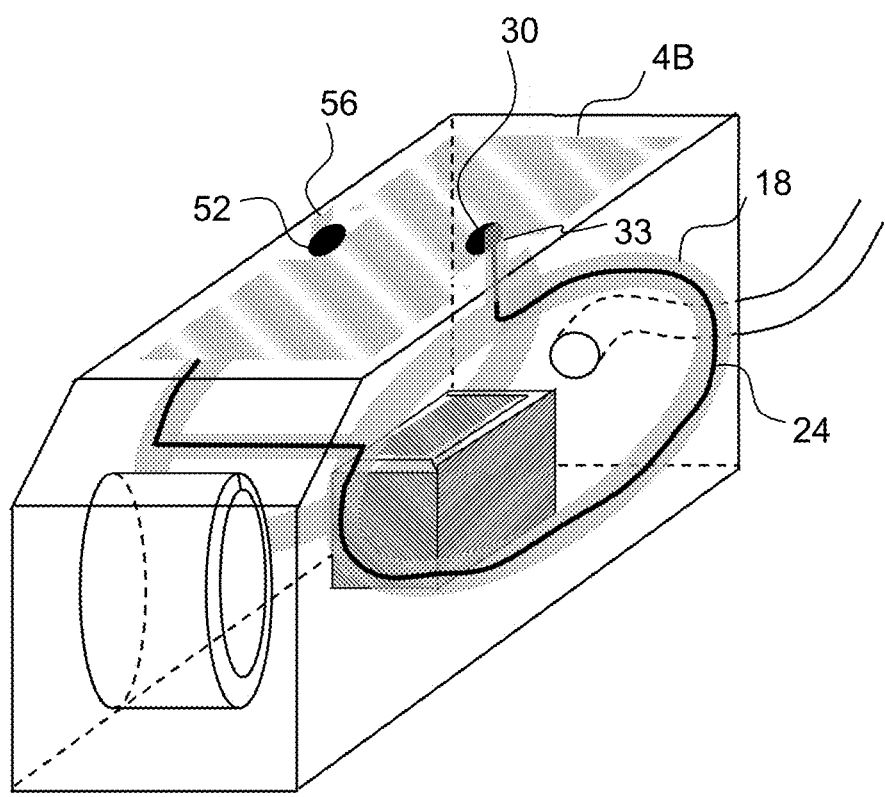
FIG. 7 is a perspective view of a hearing aid.

FIG. 7 shows an exemplary hearing aid 1. The illustrated hearing aid 1 comprises a housing 100 accommodating an electrical assembly as described herein.

Figure 8:
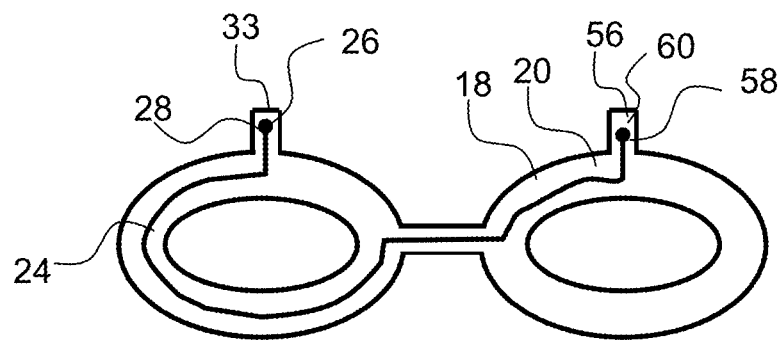
FIG. 8 shows an exemplary flexible printed circuit board.

FIG. 8 shows an exemplary flexible printed circuit board 18. The flexible printed circuit board 18 has a first flexfilm surface 20 and a second flexfilm surface (not shown). During assembly of a hearing aid, the flexible printed circuit board 18 is folded to fit inside the hearing aid housing. The flexible printed circuit board 18 comprises an antenna 24 having a first terminal 26 in a first terminal region 28 arranged in a first tab 33 of the flexible printed circuit board 18. The first tab 33 is configured to be at least partly accomodated in a first indentation of a printed circuit board. The antenna 24 has a second terminal 58 in a second terminal region 60 arranged in a second tab 56 of the flexible printed circuit board 18. The second tab 56 is configured to be at least partly accomodated in a second indentation of a printed circuit board. The flexible printed circuit board 18 is a sheet having a thickness of about 500 μm.

Figure 9:
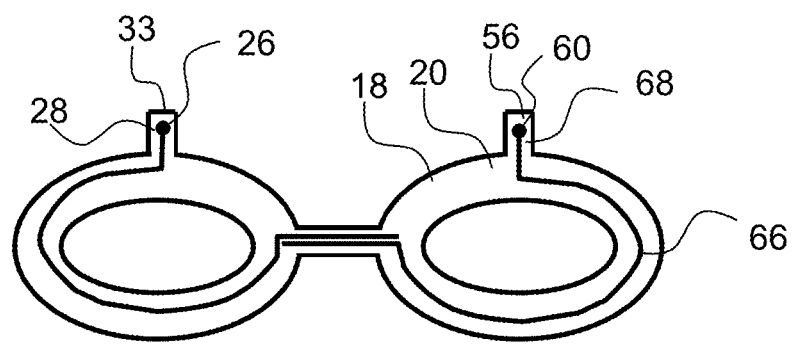
FIG. 9 shows an exemplary flexible printed circuit board.

FIG. 9 shows an exemplary flexible printed circuit board 18A. The flexible printed circuit board 18A may be implemented as the flexible printed circuit board 18 in the electrical assembly 102. During assembly of a hearing aid, the flexible printed circuit board 18A is folded to fit inside the hearing aid housing. The flexible printed circuit board 18A has a first flexfilm surface 20 and a second flexfilm surface (not shown). The flexible printed circuit board 18A comprises a first antenna 24 having a first terminal 26 in a first terminal region 28 arranged in a first tab 33 of the flexible printed circuit board 18. The first tab 33 is configured to be at least partly accomodated in a first indentation of a printed circuit board. The flexible printed circuit board 18A comprises a second antenna 66 having a first terminal 68 in a second terminal region 60 arranged in a second tab 56 of the flexible printed circuit board 18. The second tab 56 is configured to be at least partly accomodated in a second indentation of a printed circuit board. The flexible printed circuit board 18A is a sheet having a thickness of about 500 µm.

Although particular features have been shown and described, it will be understood that they are not intended to limit the claimed invention, and it will be made obvious to those skilled in the art that various changes and modifications may be made without departing from the spirit and scope of the claimed invention. The specification and drawings are, accordingly to be regarded in an illustrative rather than restrictive sense. The claimed invention is intended to cover all alternatives, modifications and equivalents.

LIST OF REFERENCES

1 hearing aid
2, 2A, 102 electrical assembly
4, 4A, 4B printed circuit board
6 edge
8 first board surface
10 second board surface
12 first pad
14 first board normal
16 first electrical component
17 second electrical component
17A third electrical component
18 flexible printed circuit board
20 first flexfilm surface
22 second flexfilm surface
24 (first) antenna
26 first terminal
28 first terminal region
30 first electrically conductive material
31 first indentation
32 first terminal normal
33 first tab of flexible printed circuit board
34 first conductor
50 second pad
52 second electrically conductive material
54 second indentation
56 second tab of flexible printed circuit board
58 second terminal
60 second terminal region
62 second board normal
64 second terminal normal
66 second antenna
68 first terminal of second antenna
$\alpha 1$ first angle
$\alpha 2$ second angle

The invention claimed is:

1. A hearing aid having an electrical assembly, the electrical assembly comprising:
a printed circuit board having a first board surface and a second board surface, the printed circuit board having a first pad in a first pad region on the first board surface, the first pad region having a first board normal;
a flexible printed circuit board comprising an antenna, the antenna having a first terminal in a first terminal region on a first flexfilm surface of the flexible printed circuit board, the first terminal region having a first terminal normal;
a transceiver mounted to the printed circuit board; and
first electrically conductive material connecting the printed circuit board and the flexible printed circuit board, wherein the first electrically conductive material connects the first pad and the first terminal, and wherein the first terminal normal and the first board normal forms a first angle that is anywhere from 30° to 150°;
wherein the first terminal of the antenna electrically couples to the first pad of the printed circuit board, the first terminal of the antenna being different from the first electrically conductive material that connects the first pad and the first terminal.

2. The hearing aid according to claim 1, wherein the first angle is anywhere from 80° to 100°.

3. The hearing aid according to claim 1, wherein the printed circuit board has a first indentation in a first edge part of the printed circuit board, the first indentation accommodating at least a part of the first terminal while the first terminal is oriented at a greater-than-zero angle with respect to a major plane of the printed circuit board.

4. The hearing aid according to claim 1, wherein the printed circuit board has an edge with an edge part and wherein the first electrically conductive material connects at least a part of the first flexfilm surface to the edge part of the printed circuit board.

5. The hearing aid according to claim 1, wherein the antenna extends from and edge of the printed circuit board in a first direction that is away from the first board surface of the printed circuit board.

6. The hearing aid according to claim 5, wherein the antenna also extends from the edge of the printed circuit board in a second direction that is away from the second board surface of the printed circuit board.

7. The hearing aid according to claim 6, wherein the second board surface is opposite from the first board surface.

8. The hearing aid according to claim 1, wherein the antenna extends along an edge of the printed circuit board.

9. A hearing aid having an electrical assembly, the electrical assembly comprising:
a printed circuit board having a first board surface and a second board surface, the printed circuit board having a first pad in a first pad region on the first board surface, the first pad region having a first board normal;
a flexible printed circuit board comprising an antenna, the antenna having a first terminal in a first terminal region on a first flexfilm surface of the flexible printed circuit board, the first terminal region having a first terminal normal; and
first electrically conductive material connecting the printed circuit board and the flexible printed circuit board, wherein the first electrically conductive material connects the first pad and the first terminal, and wherein the first terminal normal and the first board normal forms a first angle that is anywhere from 30° to 150°;
wherein the first terminal of the antenna electrically couples to the first pad of the printed circuit board, the first terminal of the antenna being different from the first electrically conductive material that connects the first pad and the first terminal;
wherein the printed circuit board comprises a second pad in a second pad region on the first board surface or on the second board surface, the second pad region having a second board normal;
wherein the flexible printed circuit board has a second terminal in a second terminal region on the first flexfilm surface or on a second flexfilm surface of the flexible printed circuit board, the second terminal region having a second terminal normal; and
wherein the electrical assembly comprises second electrically conductive material connecting the second pad and the second terminal, and wherein the second terminal normal and the second board normal forms a second angle that is anywhere from 30° to 150°.

10. The hearing aid according to claim 9, wherein the printed circuit board has a first indentation in a first edge part of the printed circuit board, the first indentation accommodating at least a part of the first terminal that is associated with the flexible printed circuit board while the first terminal is oriented at a greater-than-zero angle with respect to a major plane of the printed circuit board; and wherein the printed circuit board has a second indentation in a second edge part of the printed circuit board, the second indentation accommodating at least a part of the second terminal that is associated with the flexible printed circuit board.

11. The hearing aid according to claim 10, wherein the printed circuit board has a third indentation in a third edge part of the printed circuit board, the third indentation accommodating at least a part of a third terminal of the flexible printed circuit board while the third terminal is oriented at a greater-than-zero angle with respect to a major plane of the printed circuit board.

12. The hearing aid according to claim 9, wherein the printed circuit board comprises a third pad in a third pad region on the first board surface or on the second board surface, the third pad region having a third board normal;

wherein the flexible printed circuit board has a third terminal in a third terminal region on the first flexfilm surface or on the second flexfilm surface, the third terminal region having a third terminal normal; and wherein the electrical assembly comprises third electrically conducting material connecting the third pad of the printed circuit board and the third terminal of the flexible printed circuit board, and wherein the third terminal normal and the third board normal forms a third angle that is anywhere from 30° to 150°.

13. A hearing aid having an electrical assembly, the electrical assembly comprising:

a printed circuit board having a first board surface and a second board surface, the printed circuit board having a first pad in a first pad region on the first board surface, the first pad region having a first board normal;

a flexible printed circuit board comprising an antenna, the antenna having a first terminal in a first terminal region on a first flexfilm surface of the flexible printed circuit board, the first terminal region having a first terminal normal; and first electrically conductive material connecting the printed circuit board and the flexible printed circuit board, wherein the first electrically conductive material connects the first pad and the first terminal, and wherein the first terminal normal and the first board normal forms a first angle that is anywhere from 30° to 150°;

wherein the first terminal of the antenna electrically couples to the first pad of the printed circuit board, the first terminal of the antenna being different form the first electrically conductive material that connects the first pad and the first terminal; and wherein a distance from a surface of a part of the flexible printed circuit board where the antenna is located, to an edge of the printed circuit board, is less than a thickness of the printed circuit board.

14. A hearing aid having an electrical assembly, the electrical assembly comprising:

a printed circuit board having a first board surface and a second board surface, the printed circuit board having a first pad in a first pad region on the first board surface, the first pad region having a first board normal;

a flexible printed circuit board comprising an antenna, the antenna having a first terminal in a first terminal region on a first flexfilm surface of the flexible printed circuit board, the first terminal region having a first terminal normal;

a transceiver mounted on the printed circuit board; and first electrically conductive material connecting the printed circuit board and the flexible printed circuit board, wherein the first electrically conductive material connects the first pad and the first terminal, and wherein the first terminal normal and the first board normal forms a first angle that is anywhere from 30° to 150°;

wherein a portion of the antenna is facing an edge of the printed circuit board.

15. The hearing aid according to claim 14, wherein the first terminal of the antenna is different from the first electrically conductive material that connects the first pad and the first terminal.

16. The hearing aid according to claim 14, wherein the first terminal of the antenna is electrically coupled to the first pad of the printed circuit board.

17. The hearing aid according to claim 14, wherein a minor part of the antenna extends from the edge of the printed circuit board in a first direction that is away from the first board surface of the printed circuit board.

18. The hearing aid according to claim 17, wherein the minor part of the antenna comprises the first terminal of the antenna.

19. The hearing aid according to claim 17, wherein a minor part of the antenna extends from the edge of the printed circuit board in a second direction that is away from the first board surface of the printed circuit board.

20. The hearing aid according to claim 14, wherein the second board surface is opposite from the first board surface.

21. The hearing aid according to claim 14, wherein the first angle is anywhere from 80° to 100°.

22. The hearing aid according to claim 14, wherein the printed circuit board has a first indentation in a first edge part of the printed circuit board, the first indentation accommodating at least a part of the first terminal while the first terminal is oriented at a greater-than-zero angle with respect to a major plane of the printed circuit board.

23. The hearing aid according to claim 14, wherein both (1) the printed circuit board and (2) the portion of the antenna that is facing the edge of the printed circuit board, lie in a same plane.

24. The hearing aid according to claim 14, wherein the portions of the antenna that is facing the edge of the printed circuit board is spaced apart from the edge of the printed circuit board.

25. A hearing aid having an electrical assembly, the electrical assembly comprising:

a printed circuit board having a first board surface and a second board surface, the printed circuit board having a first pad in a first pad region on the first board surface, the first pad region having a first board normal;

a flexible printed circuit board comprising an antenna, the antenna having a first terminal in a first terminal region on a first flexfilm surface of the flexible printed circuit board, the first terminal region having a first terminal normal; and first electrically conductive material connecting the printed circuit board and the flexible printed circuit board, wherein the first electrically conductive material connects the first pad and the first terminal, and wherein the first terminal normal and the first board normal forms a first angle that is anywhere from 30° to 150°;

wherein a portion of the antenna is facing an edge of the printed circuit board;

wherein the edge of the printed circuit board has an edge part and wherein the first electrically conductive material connects at least a part of the first flexfilm surface to the edge part of the printed circuit board.

26. A hearing aid having an electrical assembly, the electrical assembly comprising:

a printed circuit board having a first board surface and a second board surface, the printed circuit board having a first pad in a first pad region on the first board surface, the first pad region having a first board normal;

a flexible printed circuit board comprising an antenna, the antenna having a first terminal in a first terminal region on a first flexfilm surface of the flexible printed circuit board, the first terminal region having a first terminal normal; and first electrically conductive material connecting the printed circuit board and the flexible printed circuit board, wherein the first electrically conductive material connects the first pad and the first terminal, and wherein the first terminal normal and the first board normal forms a first angle that is anywhere from 30° to 150°;

wherein a portion of the antenna is facing an edge of the printed circuit board;

wherein the printed circuit board comprises a second pad in a second pad region on the first board surface or on the second board surface, the second pad region having a second board normal;

wherein the flexible printed circuit board has a second terminal in a second terminal region on the first flexfilm surface or on a second flexfilm surface of the flexible printed circuit board, the second terminal region having a second terminal normal; and wherein the electrical assembly comprises second electrically conductive material connecting the second pad and the second terminal, and wherein the second terminal normal and the second board normal forms a second angle that is anywhere from 30° to 150°.

27. The hearing aid according to claim 26, wherein the printed circuit board has a first indentation in a first edge part of the printed circuit board, the first indentation accommodating at least a part of the first terminal that is associated with the flexible printed circuit board while the first terminal is oriented at a greater-than-zero angle with respect to a major plane of the printed circuit board; and wherein the printed circuit board has a second indentation in a second edge part of the printed circuit board, the second indentation accommodating at least a part of the second terminal that is associated with the flexible printed circuit board.

28. The hearing aid according to claim 26, wherein the printed circuit board comprises a third pad in a third pad region on the first board surface or on the second board surface, the third pad region having a third board normal;

wherein the flexible printed circuit board has a third terminal in a third terminal region on the first flexfilm surface or on the second flexfilm surface, the third terminal region having a third terminal normal; and wherein the electrical assembly comprises third electrically conducting material connecting the third pad of the printed circuit board and the third terminal of the flexible printed circuit board, and wherein the third terminal normal and the third board normal forms a third angle that is anywhere from 30° to 150°.

29. The hearing aid according to claim 27, wherein the printed circuit board has a third indentation in a third edge part of the printed circuit board, the third indentation accommodating at least a part of a third terminal of the flexible printed circuit board while the third terminal is oriented at a greater-than-zero angle with respect to a major plane of the printed circuit board.

30. A hearing aid having an electrical assembly, the electrical assembly comprising:

a printed circuit board having a first board surface and a second board surface, the printed circuit board having a first pad in a first pad region on the first board surface, the first pad region having a first board normal;

a flexible printed circuit board comprising an antenna, the antenna having a first terminal in a first terminal region on a first flexfilm surface of the flexible printed circuit board, the first terminal region having a first terminal normal; and first electrically conductive material connecting the printed circuit board and the flexible printed circuit board, wherein the first electrically conductive material connects the first pad and the first terminal, and wherein the first terminal normal and the first board normal forms a first angle that is anywhere from 30° to 150°;

wherein a portion of the antenna is facing an edge of the printed circuit board;

wherein a distance from (1) a surface of a part of the flexible printed circuit board where the antenna is located, to (2) the edge of the printed circuit board, is less than a thickness of the printed circuit board.

* * * * *